Figure 1:
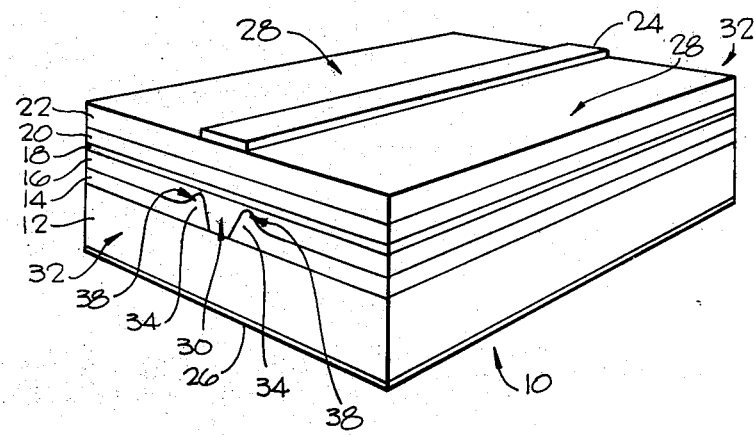

United States Patent [19]

Noad et al.

[11] 4,323,859
[45] Apr. 6, 1982

[54] CHANELLED SUBSTRATE DOUBLE HETEROSTRUCTURE LASERS

[75] Inventors: Julian P. Noad, Carp; Anthony J. Springthorpe, Richmond; Christopher M. Look, Nepean, all of Canada

[73] Assignee: Northern Telecom Limited, Montreal, Canada

[21] Appl. No.: 118,653

[22] Filed: Feb. 4, 1980

[51] Int. Cl.³ ............................................. H01S 3/19
[52] U.S. Cl. ...................................... 372/46; 357/17; 372/48
[58] Field of Search .................. 331/94.5 H; 357/17, 357/18

[56] References Cited

U.S. PATENT DOCUMENTS

| | | | |
|---|---|---|---|
| 4,099,999 | 7/1978 | Burnham et al. | 331/94.5 H X |
| 4,166,253 | 8/1979 | Small et al. | 331/94.5 H |
| 4,169,997 | 10/1979 | Logan et al. | 331/94.5 H |

Primary Examiner—James W. Davie
Attorney, Agent, or Firm—Stuart L. Wilkinson

[57] ABSTRACT

In fabricating a III-V compound, for example, GaAs, having a layered structure a first layer is grown on a planar substrate by a vapor deposition process adapted to produce differential growth while a subsequent layer is grown by a deposition process which restores planarity. In this way, a uniformly thick combination layer is produced with a non-planar junction between its composite layers. Particularly in the fabrication of channelled substrate double heterostructure lasers, a channelled blocking layer is grown by organo-metallic pyrolysis (OMP) and a subsequent confining layer is grown using liquid phase epitaxy (LPE). The OMP process produces a channel with flanking shoulder portions which permit LPE growth of a very thin confining layer immediately above the shoulder portions thereby improving linearity of the device.

4 Claims, 3 Drawing Figures

CHANELLED SUBSTRATE DOUBLE HETEROSTRUCTURE LASERS

This invention relates to methods of fabricating layered III-V compounds incorporating both planar and non-planar junctions and to structures fabricated by the methods. The invention has particular application to channelled substrate double heterostructure (DH) lasers and to methods for fabricating such lasers.

Transverse mode stability of double heterostructure semiconductor lasers is of primary concern in their application as fiber optic sources. In conventional stripe-geometry lasers, the transverse mode parallel to the junction plane can physically shift as the drive current is changed. The mode instability is caused by deformation of the gain profile, which is responsible for waveguiding in conventional stripe-geometry lasers. It is the origin of anomalous lasing characteristics such as kinks in the light output-current characteristics, beam lasing direction shifts, and deterioration of modulation characteristics. A structure proposed for stabilizing the transverse mode is the so-called channelled-substrate-planar (CSP) structure in which (AlGa)As double heterostructure layers are grown on a grooved GaAs substrate. Such lasers operate stably in the fundamental transverse mode to high excitation levels. The channel functions both to absorb higher order modes and thus concentrate the lasing light into the desired low order modes and, if a blocking layer is present, to confine current which tends to spread away from the laser stripe.

In conventional fabrication techniques, an n-type GaAs substrate has etched into it a channel from 1 to 1.5 microns deep and from 5 to 10 microns wide at the upper edges of the channel, the channel being etched into the substrate after subjecting the upper surface layer of the substrate to a Zn diffusion step to produce a p-type blocking layer. An n-type (AlGa)As confining layer is then grown by liquid phase epitaxy to fill the channel and to extend, on average, not more than 0.3 microns above the top surface of the blocking layer. Subsequently a p-type GaAlAs active layer, a p-type GaAlAs confining layer and a p-type GaAs capping layer are grown on the crystal. Frequency however the first confining layer obtained is too thick for effective mode control and produces, in consequence, the strong nonlinearities discussed above. Complications have arisen in attempting to grow a very thin first confining layer because not only is the growth rate a non-linear function of time on a smooth substrate, but there appears to be some enhancement of the growth rate over a fairly wide area in the vicinity of the groove. This is probably due to the easy initial growth on the exposed planes in the channel. Other reasons why a thin confining layer is difficult to produce are that the Zn diffusion step damages the substrate surface producing unevenness, and the epitaxially grown first confining layer itself has an uneven surface owing to surface tension effects within the liquid phase from which the layer is grown.

In order to overcome these disadvantages there is provided, according to one aspect of the invention, a double heterostructure channel-substrate-laser having a blocking layer intermediate a first confining layer and a substrate, said blocking layer having a channel extending therethrough into which said first confining layer extends, said blocking layer being spaced from a laser active layer by a distance which is less in the vicinity of the channel boundaries than at locations remote from the channel.

The channel can terminate at the substrate surface or, alternatively, can extend into the substrate itself. The channel has, preferably, sides which are inclined outwardly away from the base of the channel.

For an (AlGa)As double heterostructure channelled-substrate laser, the spacing of said blocking layer and said active layer in the vicinity of the channel boundaries is in the range of 0.3 to 0.1 microns and at the other locations, the distance is of the order of 0.5 microns. Typically the GaAs channel substrate laser has a substrate of n-GaAs, a blocking layer of p-GaAs a first confining layer of n-GaAlAs an active layer of p-GaAlAs, a second confining layer of p-GaAlAs and a capping layer of p-GaAs.

According to a second aspect of the invention there is provided a method of fabricating III-V compounds with layered structure comprising the steps of depositing over a predetermined region of a flat III-V substrate an inhibitor layer, vapour depositing a first layer of III-V compound, the inhibitor layer inhibiting such growth from occurring on its top surface but the growth occurring preferentially immediately adjacent the inhibitor layer, stripping said inhibitor layer, and growing a second layer of III-V compound using a deposition process characterised by preferential deposition of III-V compound in lower-lying regions of the substrate, whereby to produce a uniform thickness combination layer of said first and second layers in which the junction of said first and second layers is non-planar.

Particularly for fabricating a channelled-substrate-laser having a substrate, a blocking layer, a first confining layer over said blocking layer, said first confining layer extending into a channel through said blocking layer, an active layer over said first confining layer and a second confining layer over said active layer, the method can be used to grow the blocking layer so that a top surface thereof extends closer to said active layer in regions adjacent boundaries of said channel than in regions remote from the channel.

The inhibitor layer is initially deposited by, for example, chemical vapour deposition. The blocking layer is then formed on the substrate by organo-metallic pyrolysis. Organo-metallic pyrolytic deposition is characterized by no growth actually over the inhibitor layer but a relatively rapid growth in the vicinity of said inhibitor layer whereby the channel layer profile obtained has natural shoulder formations imparted to it in the vicinity of the channel. The first confining layer is then grown using a deposition process which restores a planar top surface.

In an alternative embodiment the blocking layer can be selectively etched to leave upstanding mesa formations intermediate an etched channel and etched regions of the blocking layer remote from the channel.

The organo-metallic pyrolysis is preferably of arsine and trimethyl gallium, the arsine and trimethyl gallium dissociating at about 650° C. to produce the gallium arsenide blocking layer. Subsequent confining layers and the active layer are preferably deposited using liqid phase epitaxy after the inhibitor layer, preferably chemically vapour deposited silicon dioxide, has been removed.

Figure 3:
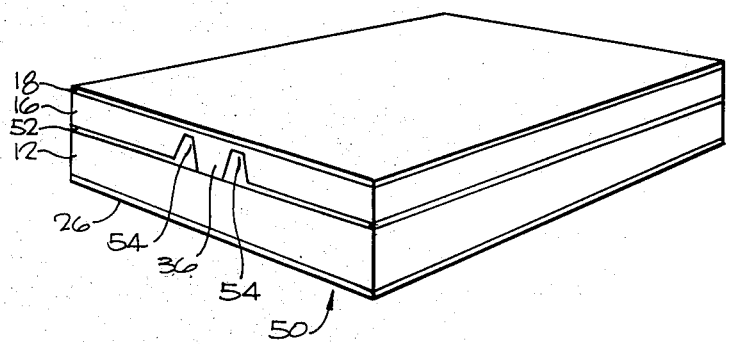
Figure 2:
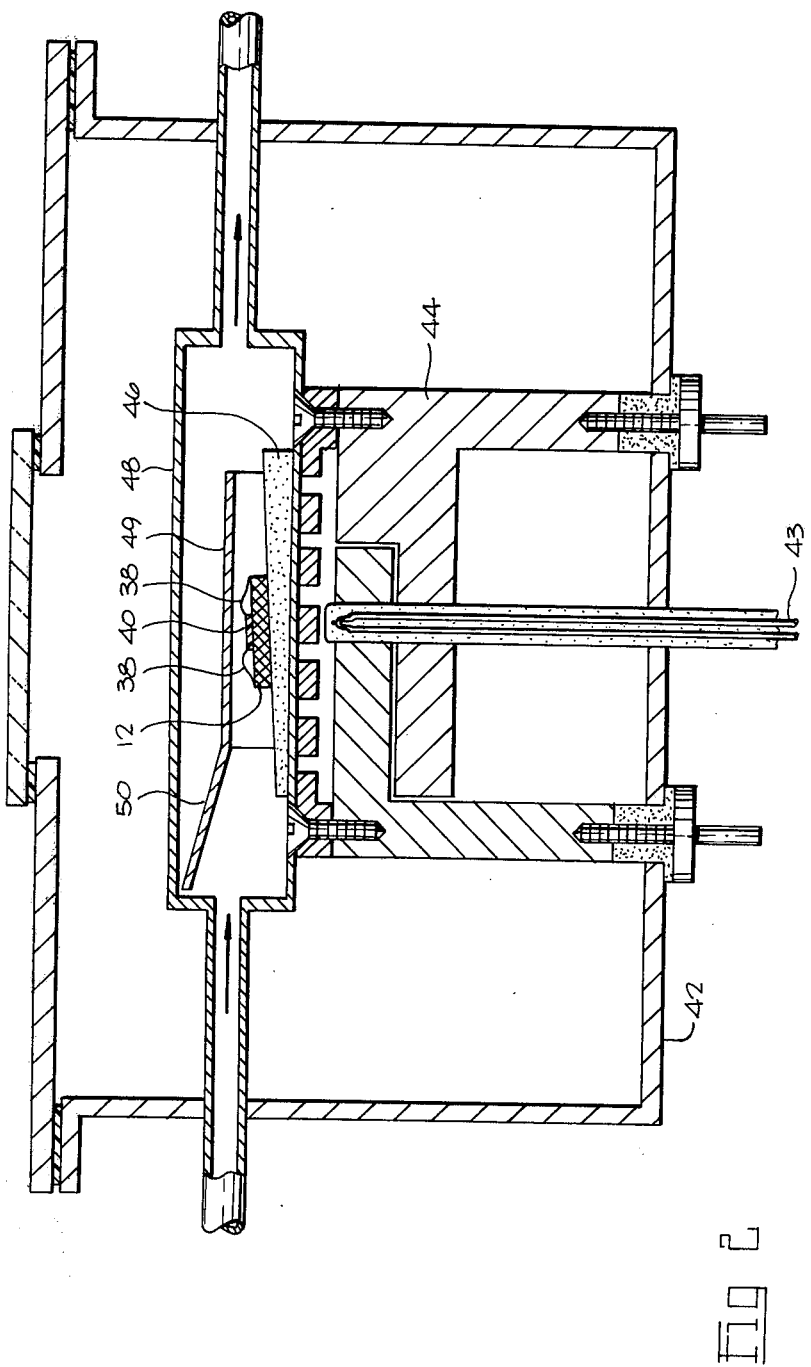

Embodiments of the invention will now be described by way of example with reference to the accompanying drawings in which:

FIG. 1 is a perspective view showing a channelled-substrate double heterostructure (DH) semiconductor laser according to the invention;

FIG. 2, which is not to scale, shows in cross-section a stage in the fabrication of the FIG. 1 laser in which a blocking layer is being deposited using organo-metallic pyrolysis;

FIG. 3 shows part of an alternative embodiment of channelled-substrate double heterostructure semiconductor laser according to the invention.

The double heterostructure (DH) semiconductor laser 10 of FIG. 1 has an n-type GaAs substrate 12 upon which are sequentially formed the following layers:

blocking layer 14; p-type GaAs; about 0.5 microns thick;

first confining layer 16; n-type GaAlAs; about 0.5 microns thick and characterized by relative high bandgap;

active layer 18; p-type GaAlAs; about 0.2 microns thick and characterized by relatively low bandgap;

second confining layer 20; p-type GaAlAs; about 1.5 microns thick and characterized by relatively high bandgap;

capping layer 22; p-type GaAs; about 0.8 microns thick.

Contacts to the DH laser are vacuum deposited as a gold stripe 24 on the capping layer 22 and a layer 26 of gold-germanium about 1000 Angstrom units thick on the undersurface of substrate 12. The top contact gold stripe 24 also defines the region within which lasing action is to occur. Regions 28 of the capping layer flanking the top contact 24 comprise a high resistivity portion induced, for example, by bombardment by high energy protons. The laser is of the channelled-substrate type, having a channel 30 formed in the blocking layer 14, the top contact stripe 24 and the channel 30 being vertically aligned with a part of the first confining layer 16 extending into the channel 30.

Opposing end faces 32 of the DH laser are cleaved to form a cavity resonator for sustaining stimulated photon emission in the active layer 18 when the p-n junction between the active layer 18 and the first confining layer 16 is forward biased.

In operation, when current is passed through the DH laser via contacts 24 and 26, current carriers injected into the active layer 18 excite atoms into higher energy states, this process continuing until there is a population inversion, there then being appreciably more atoms in the excited state than in a ground state. When this occurs, the carriers are stimulated by the optical (photon) field to recombine radiatively adding their photon of energy to the optical field. The photon emission propagates through the active layer 18 causing adjacent carriers to undergo the same energy change, the light obtained being coherent and corresponding to that change. The confining layers 16 and 20 and the cleaved facets 32 define a resonant cavity within which this stimulated process takes place. The end facets 32 act as partially reflecting mirrors allowing some fraction of this light to leave the cavity and propagate in a direction normal to the facets 32.

The influence of the channel 30 is twofold. Firstly, it acts to lower the threshold current required to induce lasing action in the laser by localizing current passage through the heterostructure to a region directly beneath the contact 24. When the laser 10 is forward biased, the reverse biased p-n junction between the first confining layer and the blocking layer inhibits current from spreading. P-type regions 34 repel the majority current carriers which are attracted to the center of the channel 30 by the n-type substrate, the overall effect being that the current path converges downwardly. By localizing the current path, the lasting region is also localized thus assuring single filament lasing.

The second effect of the channel 30 is in absorbing higher order modes which tend to be generated at high current levels. The higher order modes tend to drift out of the channel 30 and thus attempt to lase with a larger fraction of the mode occurring within the p-type regions 34. These regions act to strongly absorb the higher modes thus limiting lasing to the primary transverse mode which is generated centrally of the channel. By improving mode selection, especially at high current levels, device linearity is improved, the improvement being a function both of channel size and of the spacing between the blocking layer 14 and the active layer 18. The channel size depends somewhat on the output modes desired but for primary transverse mode output, a channel in the range 2½ to 5 microns wide and 1.0 to 1.5 microns deep has proved efficient. The spacing between the p-type blocking layer and the active layer 18 should, for maximum linearity, be as small as possible commensurate with the first confining layer 26 fulfilling its function of defining the boundary of the lasing cavity and ensuring that a proportion of current through the heterostructure is confined within the active layer 18 to provide the required lasing energy.

As previously indicated provision of a thin first confining layer has proved difficult because of the deposition techniques used and because the blocking, first combining and active layers have, to date, been essentially planar over their full extent.

The problem is alleviated by forming the blocking layer 14 with a top contour such that it is closer to the active layer 18 in the vicinity of the channel 30 than at a region remote from the channel. This allows particular attention to be paid to regulating the thickness of the first confining layer 16 in this vicinity so that linearity is determined only by that region of the first confining layer which is immediately adjacent the channel 30. The blocking layer is formed with raised shoulder portions 38 with separation of the active layer 18 and the raised shoulder portions 38 less than 0.2 microns while the spacing of the active layer 18 and the blocking layer 14 in outlying regions is on the order of 0.5 microns or more.

Referring to FIG. 2, in a preferred method of fabrication, the blocking layer 14 is grown using the method of organo-metallic pyrolosis, which process is described in detail in Device Quality Epitaxial Gallium Arsenide Grown by the Metal Alkyl-Hydride Technique, by S. J. Bass, Journal of Crystal Growth, Number 31, 1975, pages 172-178. In this method, vapour-phase epitaxial p-type gallium arsenide is grown on a gallium arsenide substrate by pyrolysing a mixture of trimethyl gallium (Ga(CH$_3$)$_3$) and arsine (asH$_3$) thus:

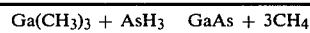

$$Ga(CH_3)_3 + AsH_3 \rightarrow GaAs + 3CH_4$$

As shown in FIG. 2, a 2000 Angstrom unit layer of SiO$_2$ is first chemically vapour deposited onto the polished surfce of an n-type GaAs substrate and, pusing conventional photolithographic techniques, a strip 40, 2.5 to 5 microns wide, is photodefined over a region of the substrate 12 which is to form a base of channel 30.

Arsine and trimethyl gallium are then fed into a small stainless steel reaction chamber 42 with relative concentrations of about 10:1 mol percent ratio. Reaction temperature is maintained at 650° C. through the agency of a thermocouple 43 and a resistively heated carbon susceptor 44 in the form of a meander resistance element which is used to heat the deposition system. A thin silica (or carbon) substrate holder 46 is centrally located in the chamber 42, the reactant gases being directed to the substrate area and partically confined there by means of a square section quartz tube 48. The substrate holder 46 has its top surface inclined so that the substrate is angled slightly towards the direction from which the reactant gases come. Over the top of the substrate holder is a quartz bridge 49 having an inclined baffle 50 which aids the production of laminar flow over the holder. The arsine is obtained from a bottled supply while the trimethyl gallium enters the reaction chamber entrained with high purity hydrogen which is bubbled through its container. In order to control the relative proportion of the various constituents, programmable mass flowmeters should be used. These can be of conventional structure and are not described or shown in the drawings.

After deposition of the blocking layer 14 is complete, the $SiO_2$ strip 40 is stripped from the substrate 12 by subjecting it to buffered hydrofluoric acid. This is followed by a 15 second etch in 1:1:6 solution of phosphoric acid; $H_2O_2$; methanol in order to prepare the blocking layer 14 and the exposed part of the substrate 12 of subsequent liquid phase epitaxial deposition of the layers 16–22.

Growth of GaAs using organo-metallic pyrolysis produces a blocking layer 14 with the characteristic raised shoulder portions 38 of FIG. 1. This non-uniform layer growth appears to be due to the fact that once the p-type GaAs is grown beyond the level of the $SiO_2$ strip 40, organo-metallic deposition takes place on both the upper surface and also on the newly exposed edge surface where the blocking layer 14 projects above the strip 40.

The contour of the blocking layer can be adjusted to a certain extent by an appropriate selection of fabrication parameters: for example; the thickness of the silica layer 40, carrier gas flow rate, and temperature. A desirable characteristic of the organo-metallic deposition is that the upper surface of the gallium arsenide obtained is much smoother than is obtained by growing a gallium arsenide layer using liquid phase epitaxy because of terracing, meniscus lines and areas of carry over produced by the latter technique. Surface smoothness is material to the subsequent liquid phase epitaxy (LPE) growth of the first confining layer 16 over the shoulder portions 38 since this layer must be less than 0.3 microns to preserve linearity. Clearly by providing a smooth blocking layer surface, growth of a confining layer in the desired thickness range is facilitated. In addition OMP provides a good surface for generating subsequent epitaxial growth.

The first confining layer and subsequent layers of the DH laser are deposited using conventional liquid phase epitaxy in a manner well known in the art. The first confining layer perferentially deposits in the channel and outlying regions so that eventually a flat upper surface is obtained upon which surface subsequent layers are deposited.

As well known in the art, a single gallium arsenide wafer would normally be processed to produce a plurality of lasers. When heterostructure growth is complete, the wafer is cleaved into individual lasers of about 250 microns X 375 microns which have a plated gold heat sink, the laser being subsequently soldered to a header for incorporation in a package (not shown).

In an alternative embodiment of FIG. 3, the channelled-substrate DH laser, a lower part 50 of which is shown, is fabricated by subjecting the upper micron of a n-type gallium arsenide substrate to a Zn diffusion to produce a p-type surface layer 52. The substrate is subsequently etched after first determining the preferential etch directions in order to produce two upstanding mesa formations 54 separated from one another by a V section channel 36 having a flat base of width 2½ to 5 microns, the upstanding mesas having a cross-sectional width of about 10 microns. The mesas function in the same way as the shoulder portions 38 of the FIG. 1 embodiment. Subsequently layers of GaAs and GaAlAs are deposited by liquid phase epitaxy as described with reference to FIG. 2.

In addition, it will be appreciated that the shoulder portions of FIG. 1 can be prepared by alternative vapour deposition techniques which show preferential growth adjacent an inhibitor layer. For example the $AsCl_3$-$H_2$-Ga system utilizes a two zone furnace. In the first zone, arsenic trichloride reacts with a Ga source thus:

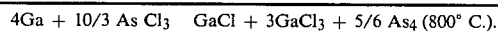
$$4Ga + 10/3\ AsCl_3 \rightarrow GaCl + 3GaCl_3 + 5/6\ As_4\ (800°\ C.).$$

Then at a second zone GaCl and arsenic react thus:

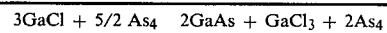
$$3GaCl + 5/2\ As_4 \rightarrow 2GaAs + GaCl_3 + 2As_4$$

Obviously more complex III-V materials can be grown by appropriately tailoring this method as in organo-metallic pyrolysis.

However organo-metallic depposition is preferred since it requires only a single temperature zone and the deposition temperature (650° C.) is relatively low so the risk of separation of metallurgical junctions from electrical junctions is less pronounced. Organo-metallic pyrolysis does not require equilibrium with the Ga source so a high flow rate can be used allowing rapid changes in composition or doping.

Any III-V layered structure having a two-layer section whose top and bottom surfaces are planar and whose contact junction is non-planar can be prepared by this method by appropriate choice of inhibitor layer position, thickness and deposition parameters. Lasers having alternative compound semiconductor layers may be produced by reacting other suitable Group III organo-metallic compounds, for example alkyl-In and alkyl-Al compounds with Group V hydrides, for example, phosphine ($PH_3$), arsine-phosphine ($AsH_3$-$PH_3$) or arsine-stibine ($AsH_3$-$SbH_3$). In addition, selenium or sulphur may be added as n-type dopants from tanks containing hydrogen selenide ($H_2Se$) or hydrogen sulfide ($H_2S$) respectively, diluted with a carrier gas; and p-type doping is obtained by passing the carrier gas over diethylzinc (DEZ).

What is claimed is:
1. A double heterostructure semiconductor laser comprising:
 a substrate;
 a blocking layer;
 a first confining layer;

an active layer;

a second confining layer;

top and bottom contacts for directing current across a pn junction existing between the active layer and the first confining layer to generate light thereat;

an np junction between the first confining layer and a blocking layer acting to confine current passage to a predetermined region of said pn junction;

the blocking layer having a channel underlying said predetermined region, said first confining layer extending into the channel;

the laser having opposed planar reflecting facets defining a resonant cavity;

and wherein the blocking layer has raised shoulder portions flanking the channel and the first confining layer is thinner where it overlies the raised shoulder portions than at a location remote from the channel.

2. A laser as claimed in claim 1, wherein said shoulder portions have a continuously curving profile.

3. A laser as claimed in claim 2 in which the substrate layer is n-GaAs, the blocking layer is p-GaAs, the first confining layer is n-GaAlAs, the active layer is p-GaAlAs and the second confining layer is p-GaAlAs.

4. A laser as claimed in claim 2 or 3 in which the separation of the active layer and the blocking layer at said raised shoulder portions is less than 0.4 microns.

* * * * *